United States Patent
Sato

(10) Patent No.: US 6,285,442 B1
(45) Date of Patent: Sep. 4, 2001

(54) EXPOSURE APPARATUS AND DEVICE MANUFACTURING METHOD USING THE EXPOSURE APPARATUS

(75) Inventor: Hiroshi Sato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/299,100

(22) Filed: Apr. 26, 1999

(30) Foreign Application Priority Data

Apr. 30, 1998 (JP) .................................................. 10-136169

(51) Int. Cl.⁷ ........................... G03B 27/42; G03B 27/54; G03B 27/72; G03B 27/32
(52) U.S. Cl. ................................. 355/67; 355/53; 355/71; 355/77
(58) Field of Search .................................. 355/67, 35, 18, 355/53, 69–71; 352/198; 362/3; 430/30; 356/399–401; 250/492.2, 492.22, 548

(56) References Cited

U.S. PATENT DOCUMENTS

| | | | |
|---|---|---|---|
| 5,251,068 | 10/1993 | Oshima et al. | 359/634 |
| 5,334,282 | * 8/1994 | Nakayama et al. | 156/643 |
| 5,526,093 | * 6/1996 | Takahashi | 355/53 |
| 5,677,757 | * 10/1997 | Taniguchi et al. | 355/71 |
| 5,760,963 | 6/1998 | Mori | 359/622 |
| 5,815,249 | * 9/1998 | Nishi et al. | 355/71 |
| 5,822,125 | 10/1998 | Meyers | 359/621 |
| 5,861,944 | * 1/1999 | Nishi | 355/68 |
| 5,926,257 | 7/1999 | Mizouchi | 355/67 |
| 5,994,006 | 11/1999 | Nishi | 430/22 |
| 6,051,842 | * 4/2000 | Yamamoto | 250/548 |
| 6,084,655 | 7/2000 | Suzuki et al. | 355/53 |

FOREIGN PATENT DOCUMENTS

| | | |
|---|---|---|
| 45-47640 | 2/1993 | (JP) . |
| 5-47626 | 2/1993 | (JP) . |
| 7-37774 | 2/1995 | (JP) . |
| 7-306304 | 11/1995 | (JP) . |
| 8-262367 | 10/1996 | (JP) . |
| 9-22869 | 1/1997 | (JP) . |
| 9-127418 | 5/1997 | (JP) . |
| 9-190969 | 7/1997 | (JP) . |
| 9-223661 | 8/1997 | (JP) . |

* cited by examiner

Primary Examiner—Russell Adams
Assistant Examiner—Hung Henry Nguyen
(74) Attorney, Agent, or Firm—Fitzpatrick, Cella, Harper & Scinto

(57) ABSTRACT

An exposure apparatus for correcting an illuminance non-uniformity taking place when illumination conditions are changed. The exposure apparatus includes an illumination optical system for illuminating a reticle having a pattern, a projection optical system for projecting the pattern onto a substrate, a lens member and a drive mechanism for changing an illuminance distribution on a surface to be illuminated, symmetrically with respect to an optical axis, and an optical filter and a drive mechanism for changing the illuminance distribution on the surface to be illuminated, asymmetrically with respect to the optical axis. The exposure apparatus separates the illuminance distribution on the surface to be illuminated into a component symmetrical with respect to the optical axis and a component asymmetrical with respect to the optical axis. (i) The lens member and the drive mechanism and (ii) the optical filter and the drive mechanism independently change the respective components.

30 Claims, 16 Drawing Sheets

FIG. 2A
FIG. 2B
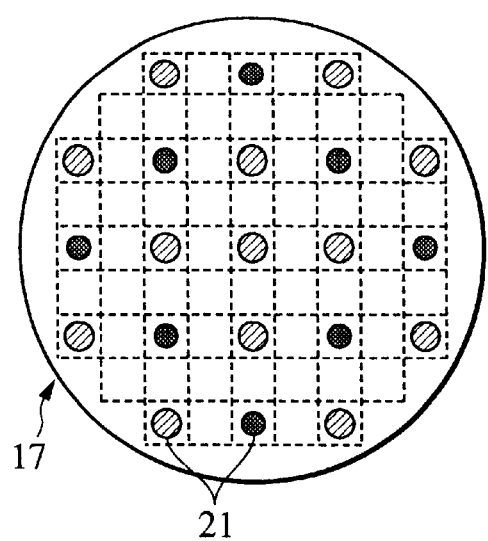
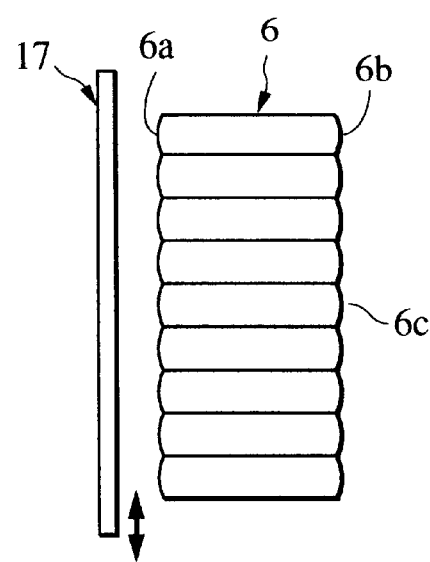

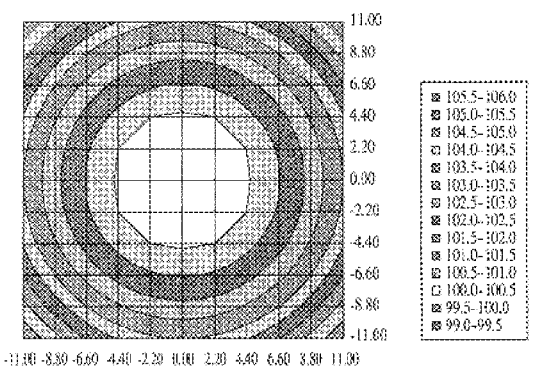 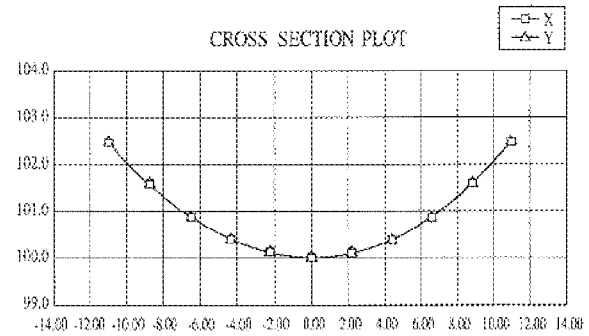
FIG. 5A(1)　　　　　　　　　　　　FIG. 5A(2)

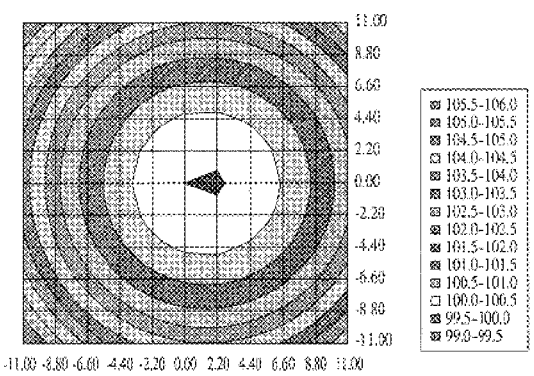 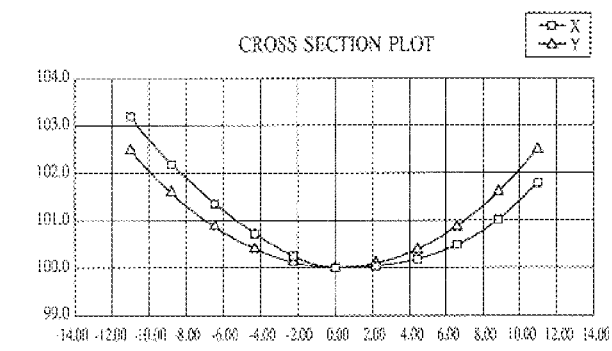
FIG. 5B(1)  FIG. 5B(2)

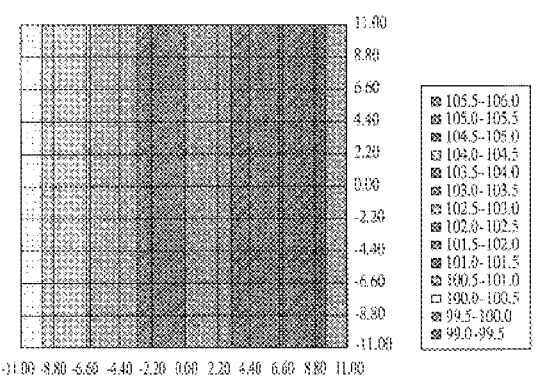
FIG. 5C(1)
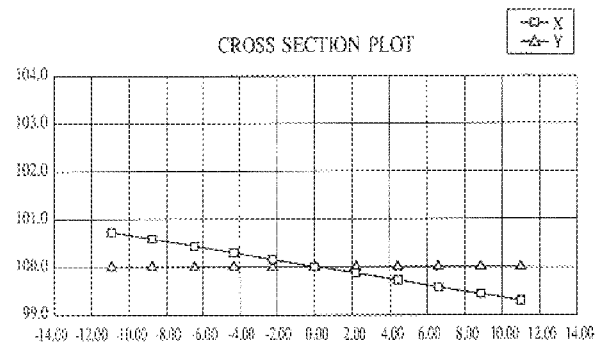
FIG. 5C(2)

FIG. 7C
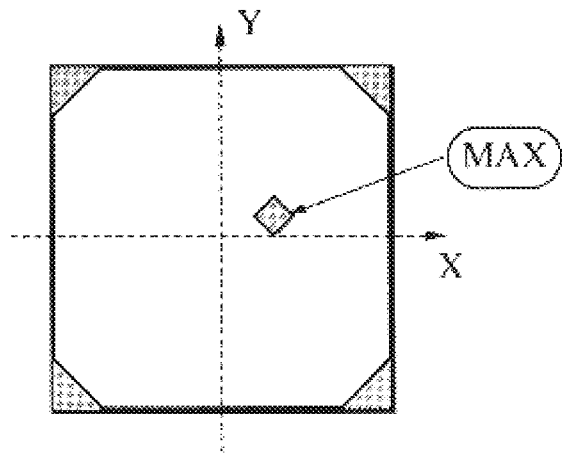
FIG. 7D(1)
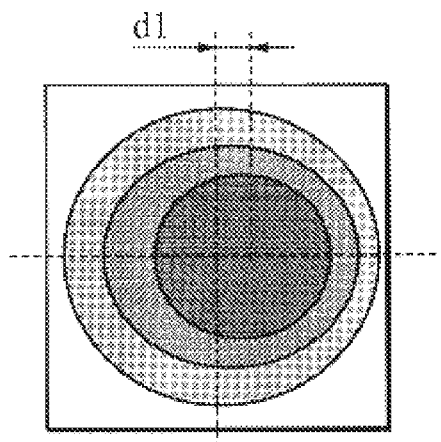
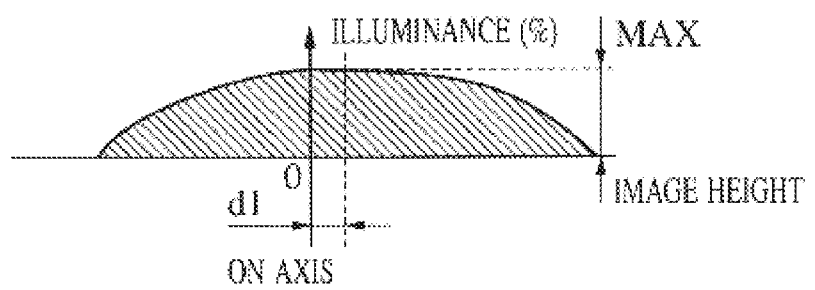
FIG. 7D(2)

EXPOSURE APPARATUS AND DEVICE MANUFACTURING METHOD USING THE EXPOSURE APPARATUS

BACKGROUND OF THE INVENTION

1. Field of the Invention

The present invention relates to an exposure apparatus and a device manufacturing method using the exposure apparatus, and, more particularly, to an exposure apparatus and a device manufacturing method using the exposure apparatus for manufacturing ICs, LSIs, CCDs and liquid-crystal panels.

2. Description of the Related Art

A projection aligner (e.g., a projection exposure apparatus) for manufacturing semiconductor devices projects a luminous flux from its illumination system (e.g., an illumination optical system) to a reticle having an electrical circuit pattern formed thereon, and exposes a wafer to the circuit pattern through a projection system (projection optical system). To enhance the resolution, the reticle surface, as a surface to be illuminated, and a wafer surface need to be uniformly illuminated.

The illumination system used in the projection aligner adopts a variety of methods for uniformly illuminating the surface. A step-and-repeat type projection aligner, simply called a stepper, employs an illumination system which is combined with a collimator lens and an optical integrator. The optical integrator is composed of a plurality of micro-lenses arranged with a predetermined pitch. The stepper thus uniformly illuminates the surface.

With the optical integrator employed, the illumination system forms secondary light sources of a number equal to the number of micro-lenses. Luminous fluxes from the secondary light sources illuminate the surface from different directions, thereby assuring a uniform illuminance distribution on the surface.

An illuminance non-uniformity S, as a measure of an illuminance unevenness on the surface to be illuminated, is expressed as Smax, representing a maximum value of the illuminance on the surface and Smin, representing a minimum value of the illuminance on the surface, as follows:

$$S=(Smax-Smin)/(Smax+Smin).$$

Conventional projection aligners control the illuminance unevenness on the surface to be illuminated to within several percent.

As a high degree of integration is promoted in ULSIs (Ultra Large Scale Integrated Circuits) today, the illuminance uniformity required in the projection of the circuit pattern is as severe as ±1%. The conventional art alone cannot fully meet such a rigorous requirement.

To enhance the resolution of the aligner, an off-axis illumination method and a super-high resolution technique employing a phase shift mask have been proposed. In such super-high resolution techniques, a σ value, which is the ratio of NAs (numerical apertures) of the illumination system and the projection system, is reduced by modifying the aperture of the illumination optical system. Alternatively, a secondary light source having an annular shape or a quadruple-pole shape is employed.

In contrast to these illumination methods (illumination modes) employing different apertures, many projection aligners adjust the position of the elements in the illumination system so that the illuminance non-uniformity is minimized in a standard illumination mode A.

When the standard illumination mode A is switched to an illumination mode B, different from the illumination mode A, such as the off-axis illumination method or small a method, the illuminance non-uniformity is not always minimized if the elements in the illumination system remain the same as in the illumination mode A.

A diversity of optical elements is employed in the optical systems in the projection aligner. These optical elements are typically provided with an anti-reflection coating. Since the optical effect of the anti-reflection coating changes as the angle of a light ray varies, peripheral illuminance on the edge of the surface to be illuminated varies when the illumination mode is switched, and illuminance non-uniformity symmetrical with respect to the optical axis takes place. When the illumination mode is switched, illuminance non-uniformity asymmetrical with respect to the optical axis takes place on the surface to be illuminated. This is because the switching of the illumination mode causes variations in the effect of the reflection non-uniformity arising from reflection from mirrors and decentralization of the optical system, and in the effect of flare arising from reflections taking place among the wafer surface, the reticle surface, the projection optical system and the illumination optical system., In the conventional projection aligner, concurrently correcting the illuminance non-uniformity symmetrical with respect to the optical axis and the illuminance non-uniformity asymmetrical with respect to the optical axis is difficult when the illumination conditions are switched.

SUMMARY OF THE INVENTION

It is an object of the present invention to provide an exposure apparatus which minimizes illuminance non-uniformity symmetrical relative to the optical axis and illuminance non-uniformity asymmetrical relative to the optical axis, taking place when illumination conditions are changed, and which projects a diversity of patterns on a reticle onto a wafer surface at a high resolution. It is also an object of the present invention to provide a device manufacturing method that employs such an exposure apparatus.

According to a first aspect of the present invention, the exposure apparatus includes an illumination optical system for illuminating a reticle having a pattern, a projection optical system for projecting the pattern onto a substrate, a first illuminance distribution changing means for changing an illuminance distribution on a surface to be illuminated, symmetrically with respect to an optical axis, and a second illuminance distribution changing means for changing the illuminance distribution on the surface to be illuminated, asymmetrically with respect to the optical axis, wherein the exposure apparatus separates the illuminance distribution on the surface to be illuminated into a component symmetrical with respect to the optical axis and a component asymmetrical with respect to the optical axis, and the first and second illuminance distribution changing means independently change the respective components.

According to another aspect of the present invention, an illumination apparatus includes an illumination optical system for illuminating a surface, a first illuminance distribution changing means for changing an illuminance distribution on the surface to be illuminated, symmetrically with respect to an optical axis, and a second illuminance distribution changing means for changing the illuminance distribution on the surface to be illuminated, asymmetrically with respect to the optical axis. The illumination apparatus separates the illuminance distribution on the surface to be illuminated into a component symmetrical with respect to the optical axis and a component asymmetrical with respect to the optical axis, and the first and second illuminance distribution changing means independently change the respective components.

According to yet another aspect of the present invention, a device manufacturing method includes steps of illuminating a reticle having a pattern, with an illumination optical system, projecting the pattern onto a substrate, using a projection optical system, changing, with a first illuminance distribution changing means, an illuminance distribution on a surface to be illuminated, symmetrically with respect to an optical axis, changing, with a second illuminance distribution changing means, the illuminance distribution on the surface to be illuminated, asymmetrically with respect to the optical axis, separating the illuminance distribution on the surface to be illuminated into a component symmetrical with respect to the optical axis and a component asymmetrical with respect to the optical axis, independently changing, with the first and second illuminance distribution changing means, the respective components, exposing the substrate to the pattern formed on the reticle and developing the pattern on the exposed substrate.

BRIEF DESCRIPTION OF THE DRAWINGS

FIGS. 2A–2B show diagrammatically the positional relationship between an optical filter 17 and an optical integrator 6;

FIGS. 5A(1)–5C(2) show correction effects of the optical filter 17;

FIGS. 7A–7D(2) show how the illuminance non-uniformity is corrected with the optical filter 17 moved in the plane perpendicular to the optical axis;

DESCRIPTION OF THE PREFERRED EMBODIMENTS

Figure 1:
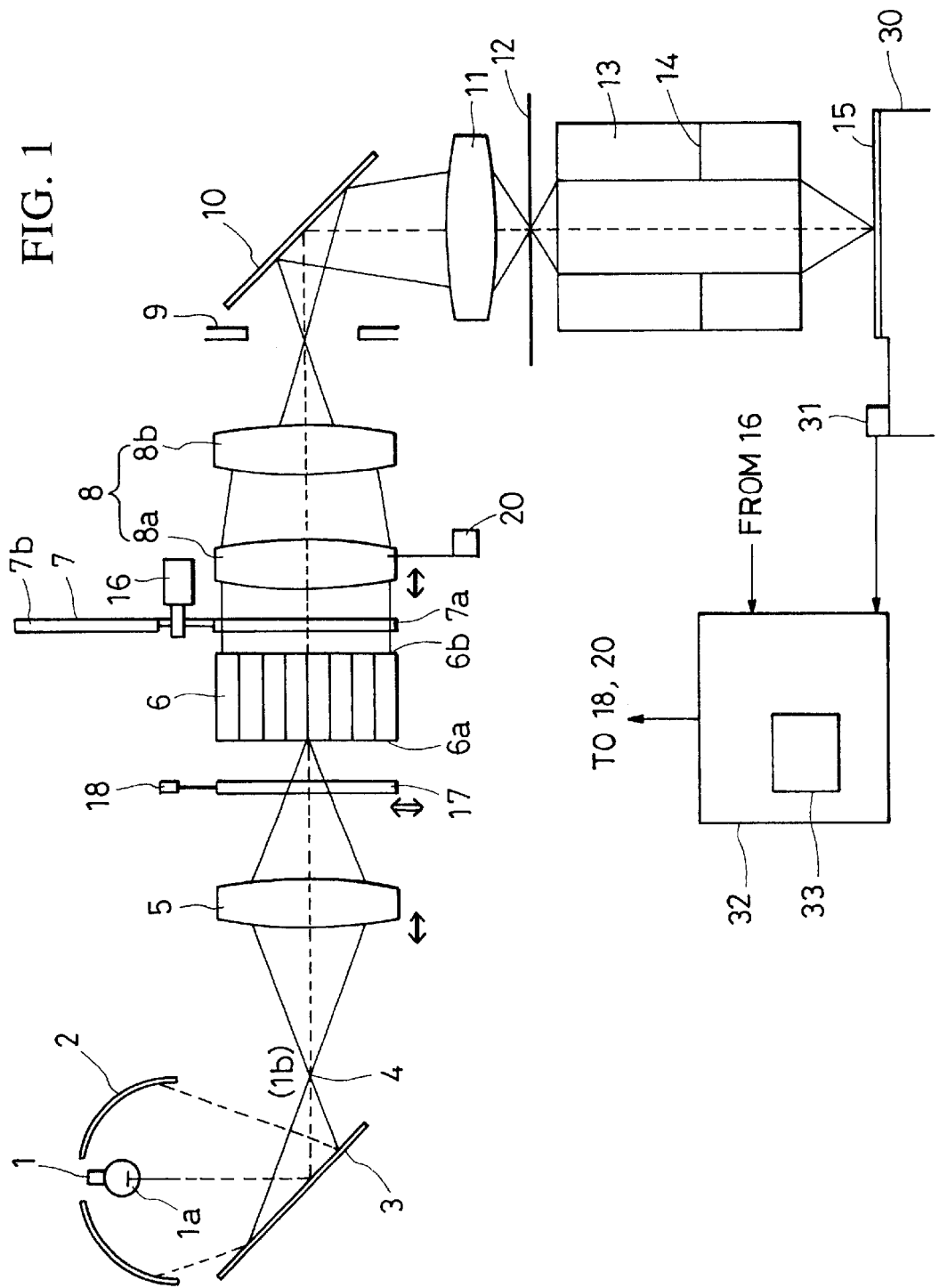
FIG. 1 is a schematic diagram showing a major portion of a projection aligner as a first embodiment of the present invention.

FIG. 1 is a schematic diagram showing a major portion of a first embodiment of the present invention. In the first embodiment, the present invention is implemented in a projection aligner (exposure apparatus) of a step-and-repeat type or of a step-and-scan type for sub-micron or quarter micron lithographs.

A light emitting tube 1, as a light source, can be a mercury lamp, for example, and has a high-luminance light emitter 1a radiating ultraviolet light and far ultraviolet light. The light emitter 1a is arranged at, or in the vicinity of, a first focus position of an elliptical mirror 2.

A cold mirror 3, constructed of a multi-layered coating, transmits most of received infrared light rays and reflects most of received ultraviolet light rays. The elliptical mirror 2 forms an image 1b of the light emitter 1a (light source image) at, or in the vicinity of, its second focus position 4, by the cold mirror 3.

An optical system 5 is composed of a condenser lens, a collimator lens, and a zoom lens, and forms an image of the light emitter image 1b, which is formed at, or in the vicinity of, the second focus position 4 of the elliptical mirror 2, at an entrance surface 6a of an optical integrator 6, through light quantity control means 17.

The optical integrator 6, as will be shown later in FIGS. 2A and 2B, is composed of a matrix of micro-lenses 6c, each having a square cross section, two-dimensionally arranged with a predetermined pitch, and forms secondary light sources in the vicinity of its exit surface 6b.

The light quantity control means 17 is arranged in the vicinity of the light entrance surface 6a of the optical integrator 6, and is moved two-dimensionally in a plane perpendicular to the optical axis by a drive mechanism 18. As will be shown later in FIGS. 2A and 2B, the light quantity control means 17 controls the quantity of light that is transmitted through at least one of a plurality of micro-lenses 6c of the optical integrator 6, using a light quantity adjuster 21 composed of an ND filter and a light shielding member. The holder (drive mechanism) 18 moves the light quantity control means 17 two-dimensionally in the plane perpendicular to the optical axis in accordance with a signal from illuminance distribution measurement means, to be discussed later. The drive mechanism 18 thus adjusts the illuminance distribution on a reticle 12, which is a surface to be illuminated, in a direction asymmetrical with respect to the optical axis (optical-axis asymmetrical component). The light quantity control means 17 and the drive mechanism 18 are elements that constitute a "second illuminance distribution changing means".

Aperture means 7 determines the shape of the secondary light sources using a plurality of apertures 7a and 7b arranged in a turret-like configuration. An aperture change mechanism (actuator) 16 switches the aperture means 7 to selectively position one of the apertures 7a and 7b in the optical path, depending on illumination conditions. Available as the apertures 7a and 7b, besides an ordinary circular aperture, are an annular or ring-shaped lighting aperture, a quadruple lighting aperture, or a small σ lighting aperture for varying the light intensity distribution on a pupillary plane 14 of a projection lens 13 (the projection optical system), to be described later. Although FIG. 1 shows only two types of apertures 7a and 7b, the aperture means 7, in practice, typically employs apertures of two or more types, in accordance with the application of the aligner.

By switching between the apertures 7a and 7b, the luminous flux entering a condenser lens 8 is changed so that the light intensity distribution on the pupillary plane 14 of the projection optical system 13 is properly controlled. The condenser lens 8 is constructed of a lens member 8a movable along the optical axis and a fixed lens 8b.

For uniform illumination, the condenser lens 8 superimposes, on a masking blade 9 as a surface to be illuminated, a plurality of luminous fluxes emitted from the secondary light sources in the vicinity of the exit surface 6b of the optical integrator 6 and transmitted through the aperture means 7. A drive mechanism 20 moves the movable lens member 8a of condenser lens 8 along the optical axis in accordance with an output from an illuminance distribution measurement means (to be described later). A distortion in the illuminance distribution on the surface to be illuminated is thus changed while the focal length of the condenser lens 8 is practically kept constant. The movable lens member 8a and the drive mechanism 20 are elements of a "first illuminance distribution changing means".

The masking blade 9, composed of a plurality of movable light shields, provides an opening of any configuration.

A mirror 10 and a focusing lens 11 project the configuration of the opening of the masking blade 9 onto a reticle 12 as a surface to be illuminated, thereby uniformly illuminating a predetermined area on the surface of the reticle 12. The reticle 12 is supported by a reticle stage (not shown). The projection optical system 13 (projection lens) projects a circuit pattern formed on the reticle 12 in a reduced size onto the surface of a wafer (substrate) 15 placed on a wafer stage 30.

In the optical systems of the first embodiment, an optically conjugate relationship holds between the light emitter 1a and the second focus position 4, between the second focus position 4 and the entrance surface 6a of the optical integrator 6, between the entrance surface 6a and the masking blade 9, between the masking blade 9 and the reticle 12, and between the reticle 12 and the surface of the wafer 15. The conjugate relationship also holds between the aperture 7 and the pupillary plane 14 of the projection optical system 13.

A light detector 31 is installed on the wafer stage 30 so that its light receiving surface remains at the same level as the surface of the wafer 15. The information about the illuminance on the wafer surface 15 (surface to be illuminated), measured by the light detector 31, is sent to a processor unit (control means) 32, and is stored in a memory 33 within the processor unit 32. The processor unit 32 also receives information about the illumination conditions from the aperture change mechanism 16. The light detector 31, the processor unit 32 and the memory 33 are elements of the above-referenced illuminance distribution measurement means. The drive mechanisms 18 and 20 operate in response to a command from the processor unit 32. The operation of the illuminance distribution measurement means during the adjustment of the illuminance distribution will be discussed later in more detail.

As disclosed in Japanese Patent Laid-Open Nos. 5-47626 and 5-47640, assigned to the same assignee as this application, one of the apertures having different opening configurations is selected from the aperture means 7 in accordance with the shape of the pattern on the reticle 12 to change variously the light intensity distribution formed on the pupillary plane 14 of the projection optical system 13.

The components from the light source 1 to the reticle 12 are elements of the illumination optical system (illumination system).

The projection aligner of the first embodiment includes the first and second illuminance distribution changing means, independent of each other, for separating a change in the illuminance distribution on the surfaces to be illuminated (i.e., the masking blade 9, the reticle 12 and the wafer 15) taking place when the illumination conditions and the illumination mode are changed, into a change in the illuminance distribution asymmetrical with respect to the optical axis and a change in the illuminance distribution symmetrical with respect to the optical axis, to correct the optical-axis symmetrical component and the optical-axis asymmetrical component.

The second illuminance distribution changing means for correcting the change in the illuminance distribution asymmetrical with respect to the optical axis includes the light quantity control means 17, which adjusts the light quantity entering at least one of the micro-lenses of the optical integrator 6, and the drive mechanism 18 for driving the light quantity control means 17 two-dimensionally in a plane perpendicular to the optical axis. The first illuminance distribution changing means for correcting the change in the illuminance distribution symmetrical with respect to the optical axis includes the drive mechanism.20, which drives, in the direction of the optical axis, part (e.g., the movable lens member 8a) of the illumination optical system for projecting the luminous flux from the optical integrator 6 to the surface to be illuminated. The first illuminance distribution changing means changes any distortion caused by the condenser lens 8 while keeping constant the focal length of the condenser lens 8. The illuminance distribution is thus changed symmetrically with respect to the optical axis. By manipulating these means, the illuminance distribution is corrected.

The operation of the light quantity control means 17, which constitutes the second illuminance distribution changing means, is now discussed. FIG. 2A is a diagrammatic view of the light entrance side of the optical filter, such as an ND filter (or light shield), as the light quantity adjuster in the light quantity control means 17 of FIG. 1. FIG. 2B is a side view of major portions of the light quantity control means (optical filter) 17 and the optical integrator 6, shown in FIG. 1.

The optical filter 17 shown in FIG. 2A includes a plurality of light quantity adjusters 21 for adjusting the passing light quantities in a plurality of areas corresponding to a plurality of micro-lenses 6c forming the optical integrator 6. As shown in FIG. 2A, the light quantity adjuster 21 is a circular ND filter for reducing the incident light quantity corresponding to each of the plurality of micro-lenses 6c of the optical integrator 6. As shown, two (or more) types of ND filters with different sizes are employed.

Referring to FIG. 2B, the optical integrator 6 is composed of the plurality of micro-lenses 6c. The back focus position of the light entrance side lens surface of the micro-lens 6c is positioned at the light exit side lens surface. The front focus position of the light exit side lens surface of the micro-lens 6c is positioned at the light entrance side lens surface. For this reason, a luminous flux focused on the light entrance side lens surface of the micro-lens 6c in the optical system 5 shown in FIG. 1 leaves the light exit side lens surface in a collimated state. The collimated luminous flux leaving the light exit side lens surface passes through the aperture 7a, is focused by the condenser lens 8, passes through the masking blade 9, is reflected from the mirror 10, and is then focused on the surface of the reticle 12 through the focusing lens 11.

In this way, the light entrance surface 6a of the optical integrator 6 is set to be optically conjugate with the masking blade 9.

The operation of the optical filter 17 of the first embodiment is now discussed. As already described, the light entrance surface 6a of the optical integrator 6 is optically conjugate with the surface to be illuminated, such as the surface of the wafer 15. The optical filter 17 for correcting the illuminance non-uniformity is spaced apart from the light entrance surface 6a of the optical integrator 6 by a predetermined distance D. As the distance D gets longer, the border between the area with its illuminance lowered by the ND filter and the area with its illuminance not lowered becomes unclear, and the illuminance distribution on the surfaces to be illuminated (of the masking blade 9, reticle 12 and wafer 15) drops in a mildly reduced profile rather than in a sharp rectangular profile.

Figure 3A:
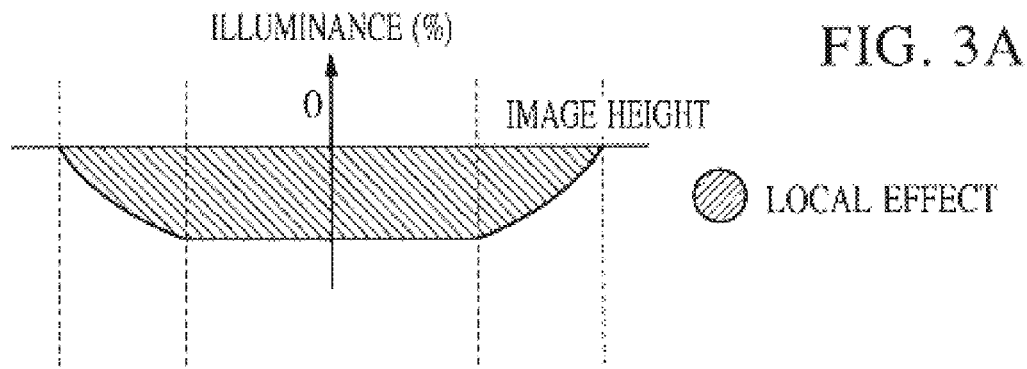
FIGS. 3A–3D show characteristic changes in illuminance distribution on the surface to be illuminated by the optical filter 17.
Figure 3B:
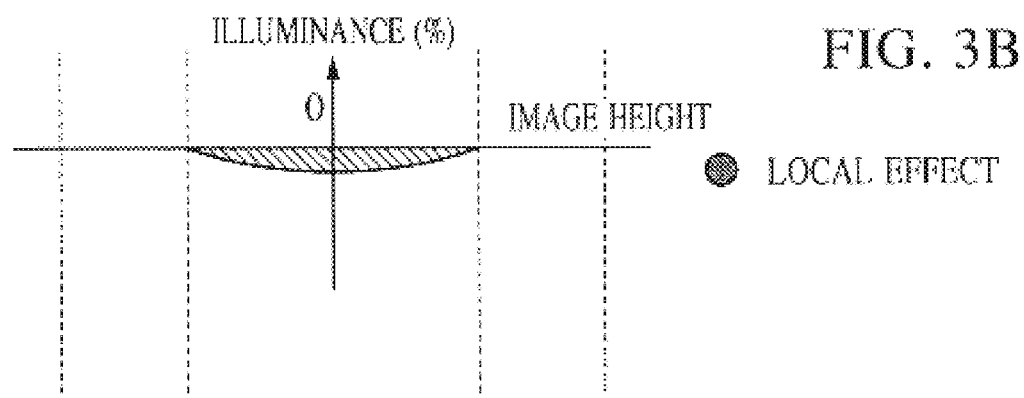
Figure 3C:
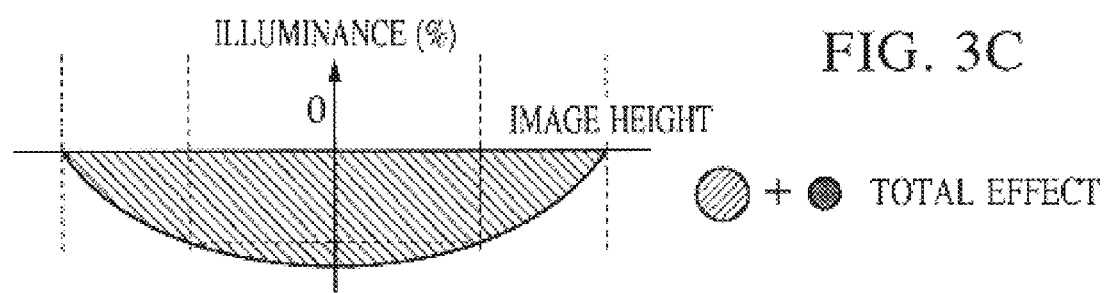
Figure 3D:
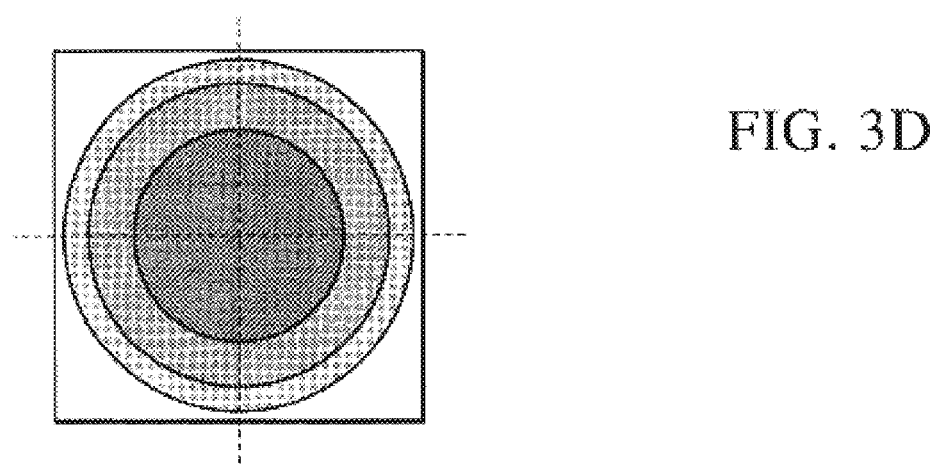

Referring to FIGS. 2A and 2B, the circular ND filters of different sizes are arranged in positions corresponding to the micro-lenses 6c of the optical integrator 6 so that the ND filters of different sizes result in an overall illuminance drop effect as shown in FIGS. 3A and 3B. By properly setting up the diameter, transmittance and position of each ND filter, as shown in FIG. 3C, representing the sum of the effects shown in FIG. 3A and FIG. 3B, the illuminance on the surface to be illuminated is decreased at the center, but is relatively increased on the periphery, approximately in proportion to the square of an image height.

If an attempt is made to satisfy, at the same time, both the uniformity of the numerical aperture on the surface to be illuminated and the uniformity of the illuminance distribution in the illumination system in the typical projection aligner, the illuminance on the periphery tends to drop because of the deviation of the optical integrator 6 from the sine condition and the angular characteristics of an anti-reflection coating used in the lens. For this reason, the optical filter of this embodiment having the function of relatively increasing the illuminance on the periphery is useful for the correction of the illuminance distribution.

In the first embodiment, almost no disturbance is caused in telecentric property because the light quantity transmitted through the micro-lens is adjusted symmetrically with respect to the optical axis. The illuminance distribution is thus adjusted over the entire surface to be illuminated by determining the configuration, transmittance and distance D of the transmittance adjuster of the ND filter.

However, when the illumination mode is changed, a different optical path is used and illuminance non-uniformity takes place on the surface 9 to be illuminated, under the influence of flair and decentralization of the lens system and the characteristics of the coating of the lens.

Figure 4A:
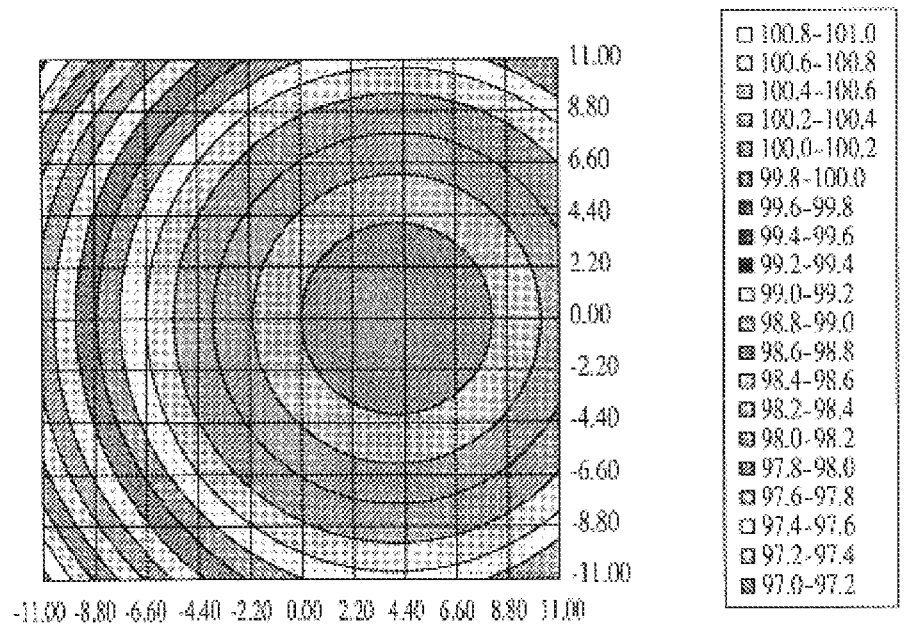
FIGS. 4A–4D show the illuminance distribution when the illumination mode is changed in the projection aligner.
Figure 4B:
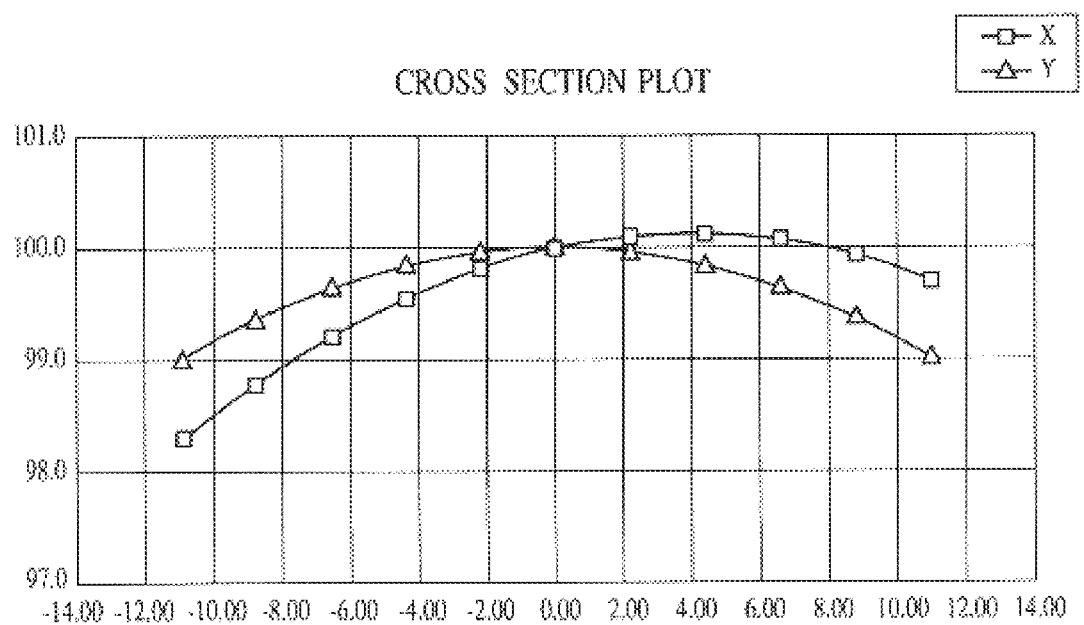

The illumination non-uniformity takes place two-dimensionally as shown in FIG. 4A and in an XY cross section shown in FIG. 4B when the illumination mode is changed. The correction of such illuminance non-uniformity is now discussed.

In the first embodiment, the optical filter 17 raises an outermost off-axis peripheral illuminance by 5% relative to an on-axis illuminance and the shifting of zoom driving from 0% to 100% raises an outermost off-axis peripheral illuminance by 5% relative to the on-axis illuminance.

Figure 4C:
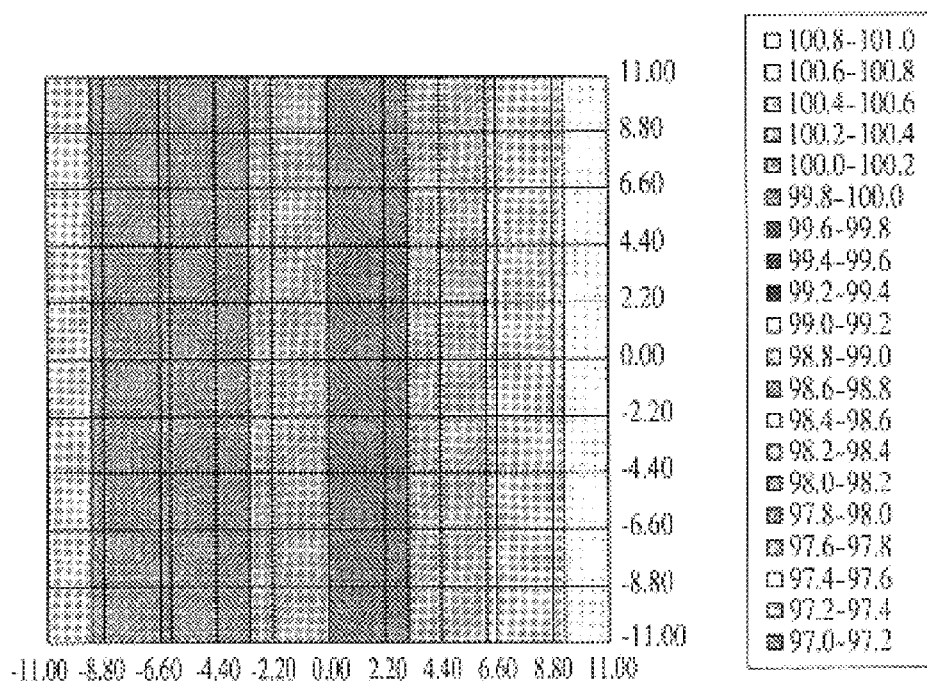
Figure 4D:
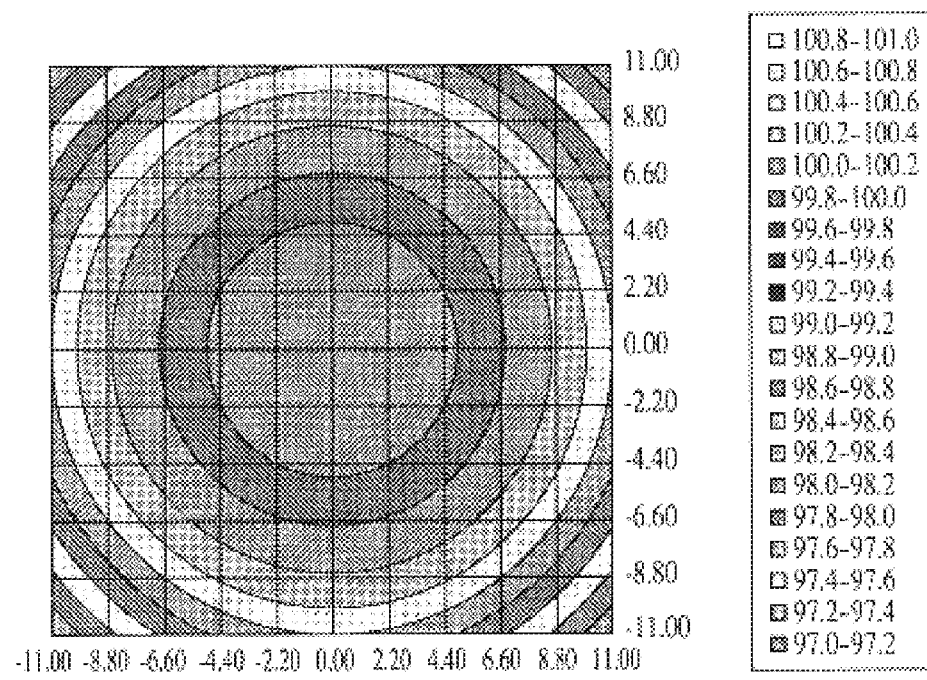

Referring to FIG. 4C and FIG. 4D, the illuminance non-uniformity is divided into an illuminance non-uniformity component asymmetrically inclined with respect to the optical axis and an illuminance non-uniformity component concentrically symmetrically distributed with respect to the optical axis. These illuminance non-uniformity components are separated by extracting an averaged illuminance on a per image-height basis from the illuminance distribution on the surface to be illuminated, measured by the above-described illuminance distribution measurement means.

In the first embodiment, illuminance non-uniformity asymmetrically inclined with respect to the optical axis at outermost off-axis points in the X-axis direction is ±1% (FIG. 4C); and a peripheral illuminance drop in the ratio of on-axis illuminance to outermost off-axis illuminance is −2% (FIG. 4D).

The method of correcting illuminance non-uniformity components thus separated is now discussed.

Correction Method of Illuminance Non-uniformity Asymmetrically Inclined with Respect to the Optical Axis As already described, the optical filter 17 of the first embodiment had the capability to raise relatively the peripheral illuminance distribution by 5% in proportion to the square of the image height. Now, the effective diameter of each micro-lens of the optical integrator 6 is equal to that of the surfaces to be illuminated of the wafer and reticle, and the effective entrance surface of each micro-lens of the optical integrator 6 is expressed by normalized XY coordinates. The effectiveness z of the illuminance distribution correction by the optical filter 17 is expressed as follows:

$$z = 5\sqrt{x^2 + y^2}.$$

The effect of this correction is shown in FIGS. 5A(1) and 5A(2).

A change one-dimensionally inclined in the illuminance distribution is generated by moving the optical filter 17 two-dimensionally in a plane perpendicular to the optical axis. In other words, the illuminance non-uniformity asymmetrical with respect to the optical axis is corrected by moving the optical filter 17 in the plane perpendicular to the optical axis. The following equation holds:

$$dz/(dx \cdot dy) = 10(x+y).$$

To correct the inclined illuminance non-uniformity by ±1% in the direction of the X axis, the optical filter 17 needs to be moved by x=0.1 in the X-axis direction. The correction effect of the optical filter 17 is shown in FIGS. 5B(1) and 5B(2), and the change between the effect in FIGS. 5A(1) and 5A(2) and the effect in FIGS. 5B(1) and 5B(2) is shown in FIGS. 5C(1) and 5C(2).

The effectiveness of the optical filter 17 is slightly different from illumination mode to illumination mode, in practice. In the first embodiment, the effectiveness of the optical filter 17 is calculated in accordance with a flow diagram shown in FIG. 6 to correct the illuminance non-uniformity asymmetrical with the optical axis. FIGS. 7A and 7B show the direction of movement of the optical filter 17.

Illuminance is beforehand measured at four peripheral points (shadowed portions in FIG. 7C) on the surface to be illuminated, by the illuminance distribution measurement means, to be used as basic data (step S101). Referring to FIG. 7C, the X coordinate and the Y coordinate are set up in a plane perpendicular to the optical axis. The illuminance distribution measurement means moves the optical filter 17 in the X axis and Y axis directions by a predetermined distance d0 to measure the illuminance distribution (steps S102–S105). The processor unit 32 calculates the changes in the illuminance distribution at the four peripheral points on the surface to be illuminated, and stores, in the memory 33, the effectiveness value of the change resulting from the movement of the optical filter 17 (step S106). Based on the effectiveness value, the processor unit 32 calculates the direction and distance of travel the optical filter 17 is required to move (step S107).

In accordance with the result of the calculation, the optical filter drive mechanism 18 moves the optical filter 17 in a predetermined direction by a predetermined distance (step S108). The illuminance distribution is again measured subsequent to the movement (step S109). If an optimum illuminance distribution is reached, the process ends. If a further correction is needed, the above steps are repeated to optimize the illuminance distribution (steps S110 and S111). FIGS. 7D(1) and 7D(2) show the change in the illuminance non-uniformity in the correction process.

Correction Method of the Illuminance Non-uniformity Symmetrical with Respect to the Optical Axis When the peripheral illuminance changes from illumination mode to illumination mode, in one adjustment method, the lens member 8a of the condenser lens 8 arranged between the optical integrator 6 and the surface to be illuminated is moved in the direction of the optical axis.

The distortion in the illuminance distribution is changed while the focal length of the condenser lens 8 is substantially kept constant. In this way, the peripheral illuminance on the surface to be illuminated is increased or decreased.

Referring to FIG. 4D, the peripheral illuminance drops by 2%. The lens member 8a has the capability to increase the peripheral illuminance by 5% when it is driven from 0% to 100% within its driving range. For example, to increase the peripheral illuminance by 2%, the lens member 8a is driven to 40% of a full range.

Figure 8:
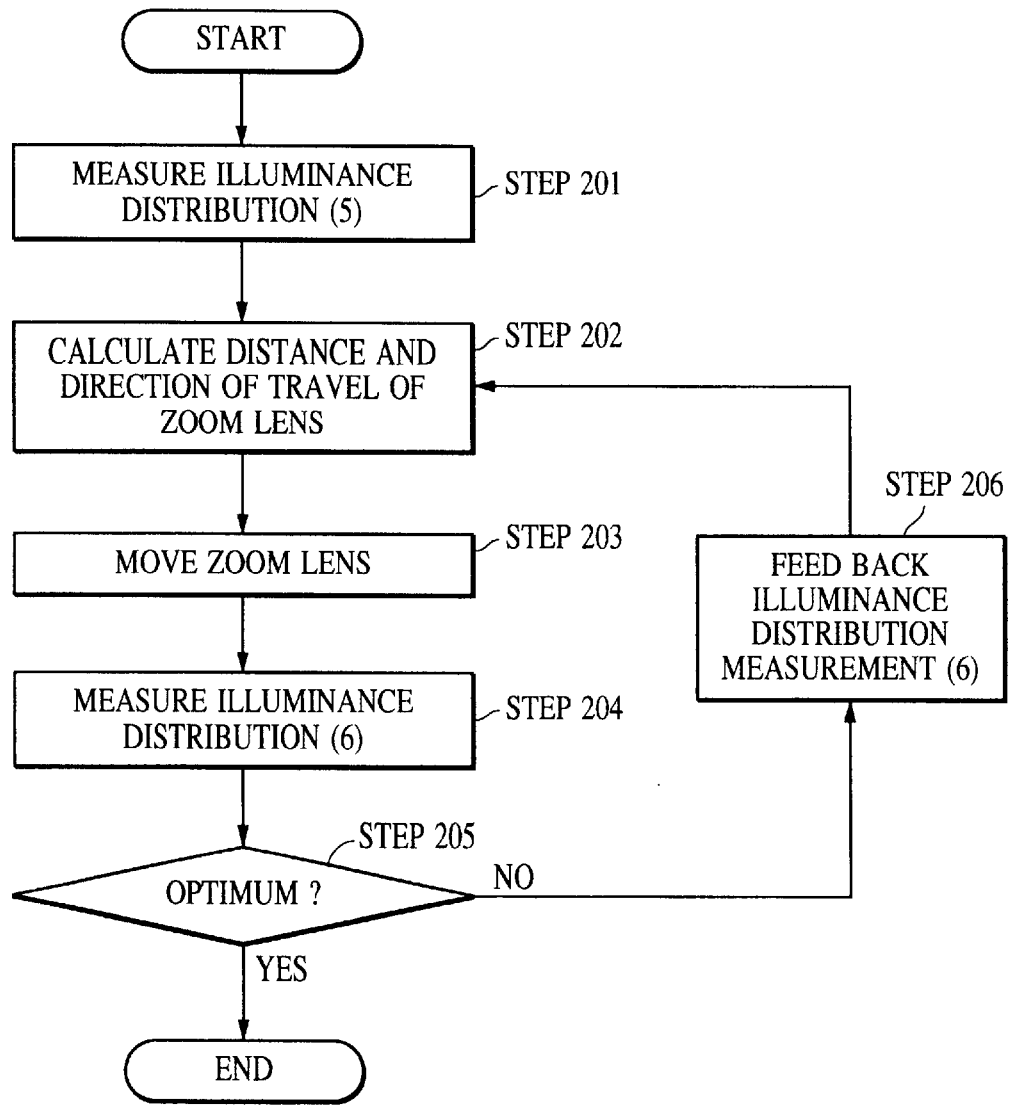
FIG. 8 is a flow diagram showing the illuminance non-uniformity correction process with a lens member 8a moved along the optical axis.
Figure 9A:
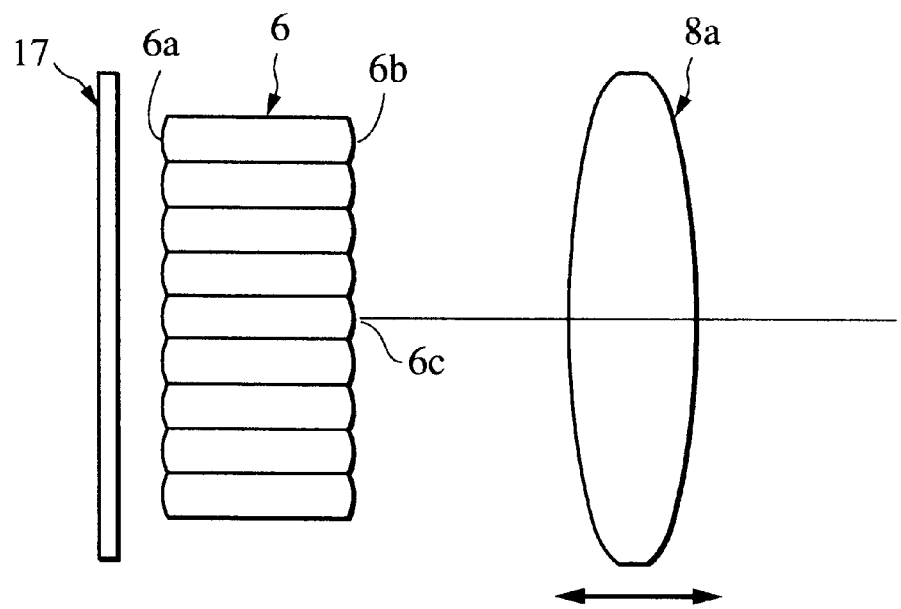
FIGS. 9A and 9B show how the illuminance non-uniformity is corrected with the lens member 8a moved along the optical axis.

FIG. 8 is a flow diagram showing the process for changing the peripheral illuminance in the first embodiment. FIG. 9A shows the direction of movement of the lens member 8a.

Figure 9B:
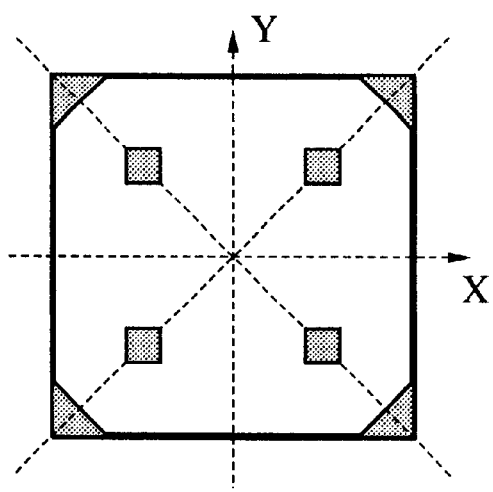

Illuminance is beforehand measured at four outermost points and at four points at 50% of the outermost range on the surface to be illuminated, as represented by the shadowed portions in FIG. 9B (step S201), and is used as basic data. The memory 33 stores the effectiveness over the illuminances at the four outermost points and at the four points at the 50% of the outermost range in the surface to be illuminated, when the lens member 8a is moved by a predetermined distance d0 in the direction of the optical axis. The effectiveness value may be determined beforehand using simulation. The processor unit 32 calculates the direction and distance of travel the lens member 8a is required to move (step S202). In accordance with the result of the calculation, the drive mechanism 20 moves the lens member 8a in a predetermined direction by a predetermined distance to adjust the peripheral illuminance (step S203). The illuminance distribution is again measured subsequent to the movement (step S204). If an optimum illuminance distribution is reached, the process ends. If a further correction is needed, the above steps are repeated to optimize the illuminance distribution (steps S205 and S206).

As described above, the illuminance non-uniformity asymmetrical with respect to the optical axis is corrected by moving the optical filter 17 in the plane perpendicular to the optical axis and the illuminance non-uniformity symmetrical with respect to the optical axis is corrected by moving the lens member 8a in the direction of the optical axis. The illuminance distribution is thus finely corrected in compliance with the illumination mode by performing the two processes.

Figure 6:
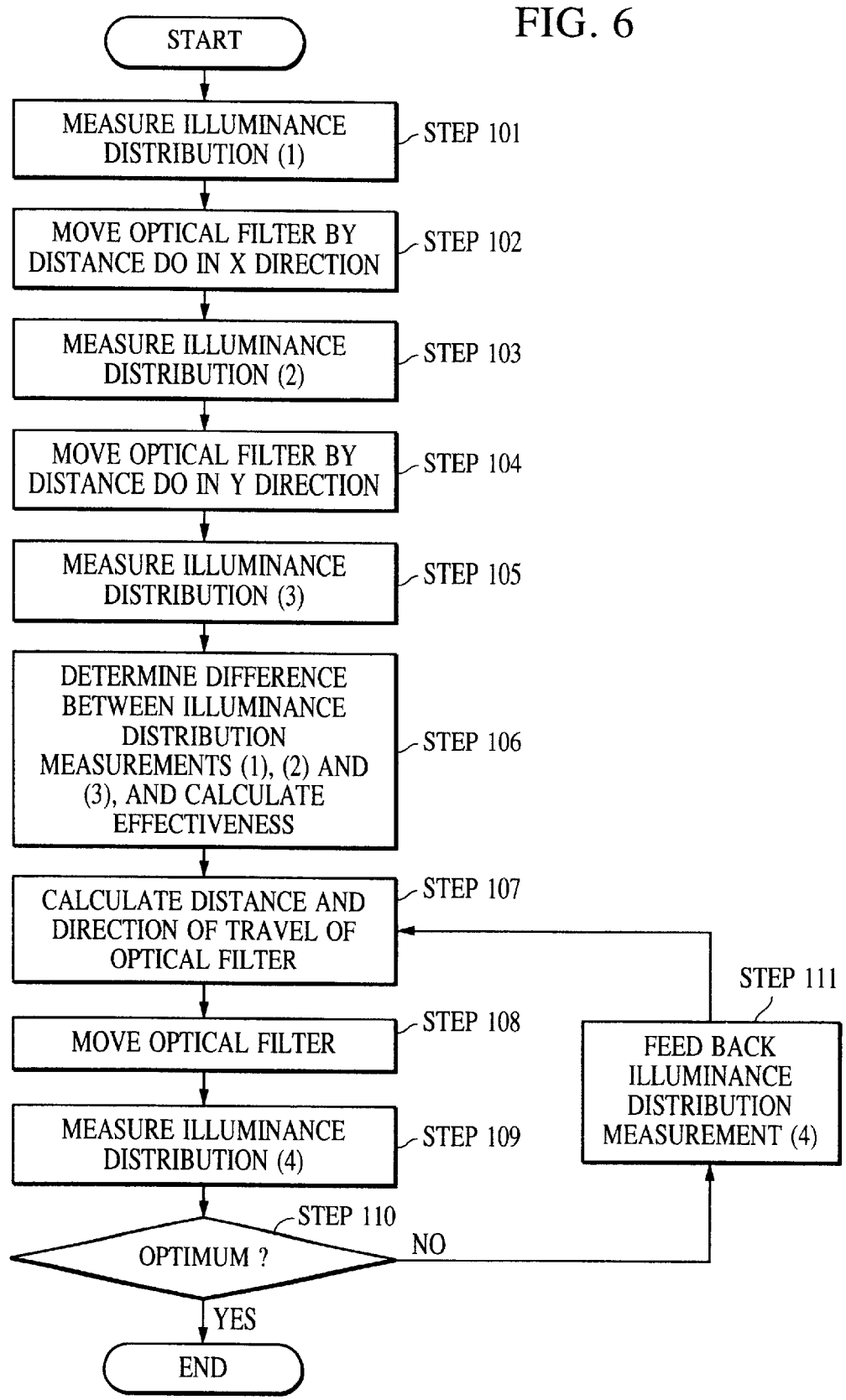
FIG. 6 is a flow diagram showing an illuminance non-uniformity correction process with the optical filter 17 moved in a plane perpendicular to an optical axis.
Figure 7A:
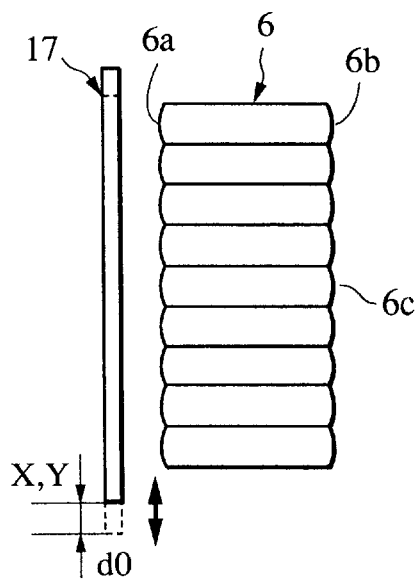
Figure 7B:
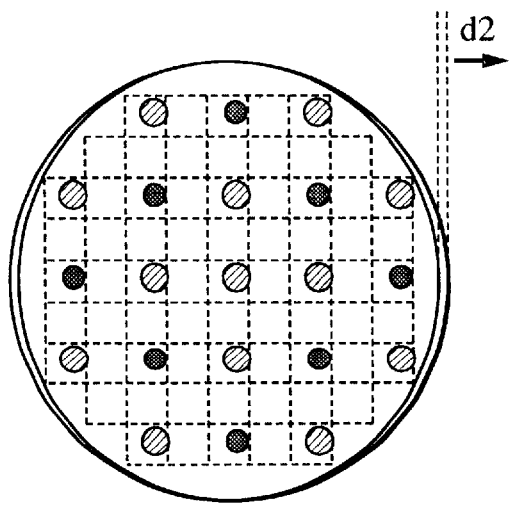

The processes illustrated in the flow diagrams shown in FIG. 6 and FIG. 8 may be executed serially one process after another, or the two processes may be executed at one time, in parallel.

Figure 10:
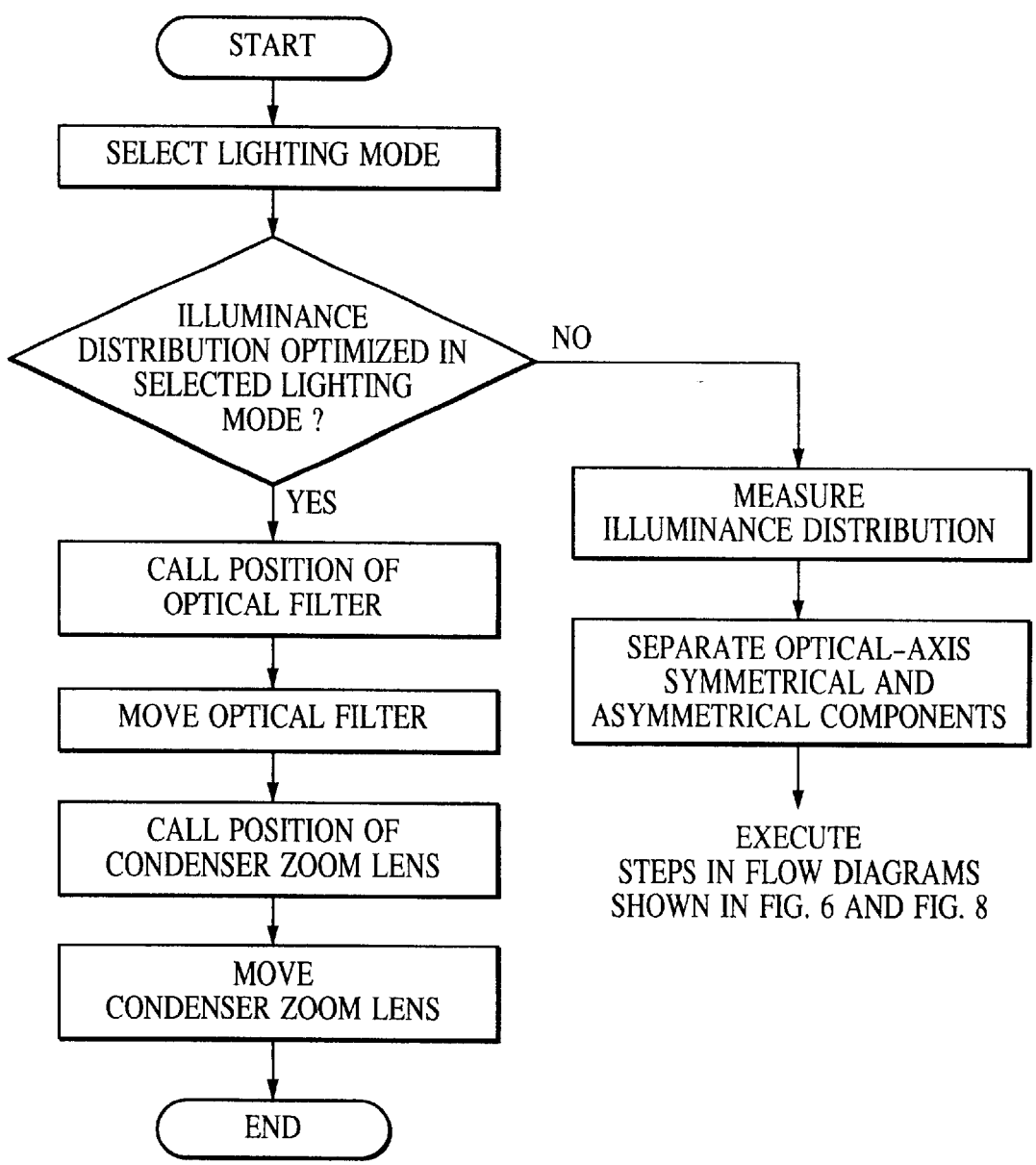
FIG. 10 is a flow diagram showing an illuminance distribution optimization process when the illumination mode is switched in the projection aligner.

After the illuminance non-uniformity is corrected, the process results (i.e., the position of the optical filter and the position of the condenser lens) in FIG. 6 and in FIG. 8 are stored in the memory 33. When the same illumination conditions are used again, the processor unit 32, receiving the information about the illumination conditions from the aperture change mechanism 16, retrieves the process results, and simply drives the optical filter 17 and the lens member 8a to their optimum positions. Without the need for repeating execution of the process steps shown in FIG. 6 and FIG. 8, the processor unit 32 quickly optimizes the illuminance non-uniformity as shown in a flow diagram in FIG. 10.

Figure 11:
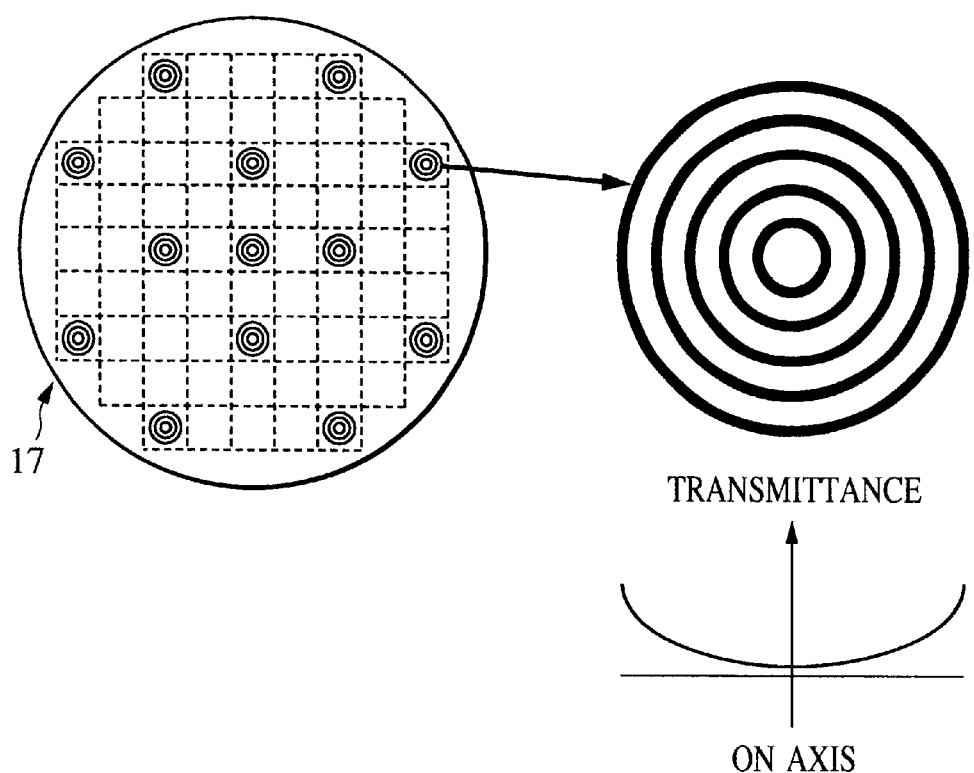
FIG. 11 is an explanatory diagram showing a second embodiment of the optical filter 17.

A filter other than the one shown in FIG. 2 may be used as long as it has the capability to increase the peripheral illuminance relative to the on-axis illuminance in proportion to the square of the image height, as in the first embodiment. As shown in FIG. 11, for example, a filter that continuously changes its transmittance from the center, with respect to the micro-lenses of the optical integrator, is used.

By optimizing the transmittance of the ND filter in the first embodiment as shown in FIG. 2 and FIG. 11 and using many transmittance adjusters, the same correction method may be used in the standard illumination mode and many other illumination modes including the annular illumination, quadruple illumination, and small σ illumination for use in a phase shift mask.

When a number of patterns are used as described above, the transmittance adjusters are arranged in the center or at the four corners of a square in a rotational symmetrical configuration to minimize a disturbance in the telecentric property. Furthermore, the transmittance adjusters spaced the same distance apart from the center are designed to have an equal transmittance.

The off-axis illumination method and the small σ illumination method have a small number of luminous fluxes superimposed from the optical integrator 6, compared with the standard lighting method. For this reason, the contribution of the optical integrator 6 per micro-lens to the surface to be illuminated is increased, and consideration must be given to selecting the transmittance of the ND filter.

A desired transmittance is imparted to the ND filter and light shielding member in the first embodiment by depositing a metal coating of Cr or the like or a multi-layered dielectric coating onto a glass substrate or mixing a coloring material into a substrate itself. Another optical member may be used as long as it offers the optical properties identical to those of the ND filter.

The illuminance non-uniformity correction method may be used not only when an illuminance non-uniformity takes place by the switching of the illumination mode, but also when an illuminance non-uniformity takes place in the standard illumination method, such as in the aging process.

Points other than the outermost four points for calculation of the effectiveness value may be used in the flow diagram shown in FIG. 6 or illuminance data at 30% or 70% of the image height, rather than the illuminance data at 50% of the image height used in FIG. 8, may be used to optimize the illuminance distribution correction.

The first embodiment employs the mercury lamp as an effective light source. Alternatively, a laser may be used as an effective light source without the need for any modification in the system.

In the first embodiment with the components arranged as described above, the illuminance non-uniformity symmetrical with respect to the optical axis, and the illuminance non-uniformity asymmetrical with respect to the optical axis are minimized when the illumination conditions are changed. A projection aligner, projecting a variety of patterns on the reticle onto the wafer surface at a high resolution, is thus provided.

In connection with the illuminance non-uniformity taking place when the illumination mode is changed, the illuminance non-uniformity component asymmetrical with respect to the optical axis and the illuminance non-uniformity component symmetrical with respect to the optical axis are efficiently corrected. The projection aligner with the optical integrator thus achieves a uniform illumination. The illuminance non-uniformity is minimized in various illumination modes. A projection aligner projecting a variety of patterns on the reticle onto the wafer surface at a high resolution is thus provided.

A second embodiment for a method of manufacturing semiconductor devices, employing the projection aligner is now discussed.

Figure 12:
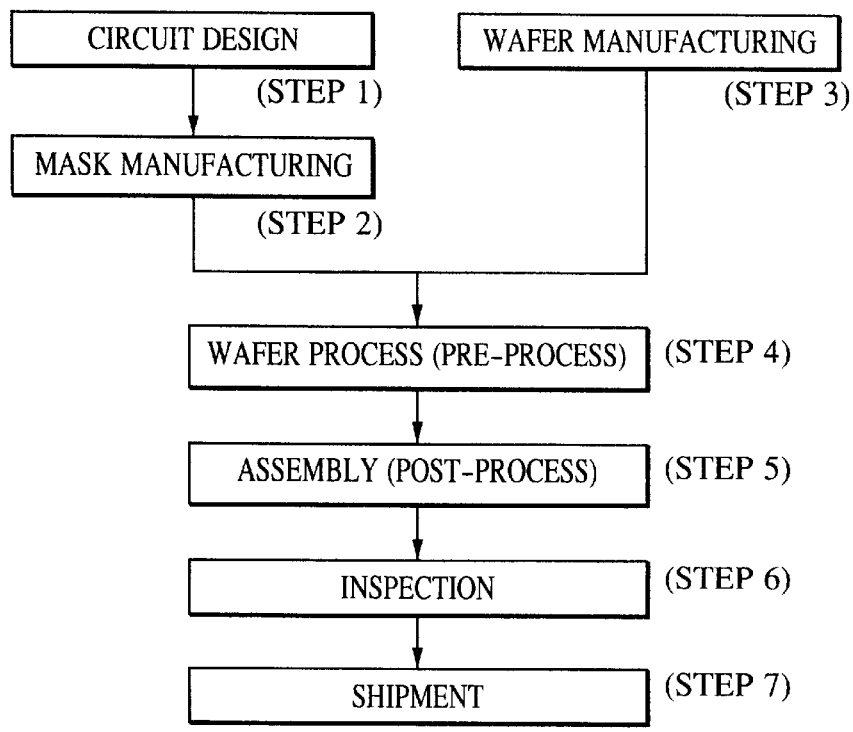
FIG. 12 is a flow diagram showing a method for manufacturing a device.

FIG. 12 is a flow diagram showing a process for manufacturing semiconductor devices (e.g., semiconductor chips such as ICs and LSIs, liquid-crystal panels, and CCDs).

In step 1 (circuit design), a circuit of a semiconductor device is designed. In step 2 (mask manufacturing), a mask of the circuit pattern so designed is manufactured.

In step 3 (wafer manufacturing), a wafer is manufactured using a material such as silicon. Step 4 (wafer process) is called a pre-process, and forms an actual circuit on the wafer using the so prepared mask and the wafer through lithographic techniques.

Step 5 (assembly) is called a post-process, and produces a semiconductor chip from the wafer manufactured in step 4. Step 5 includes an assembly step (dicing and bonding), and a packaging step (chip encapsulating).

In step 6 (inspection), operation tests and endurance tests are conducted on the semiconductor device manufactured in step 5. After undergoing these steps, the semiconductor device is completed and shipped (step 7).

Figure 13:
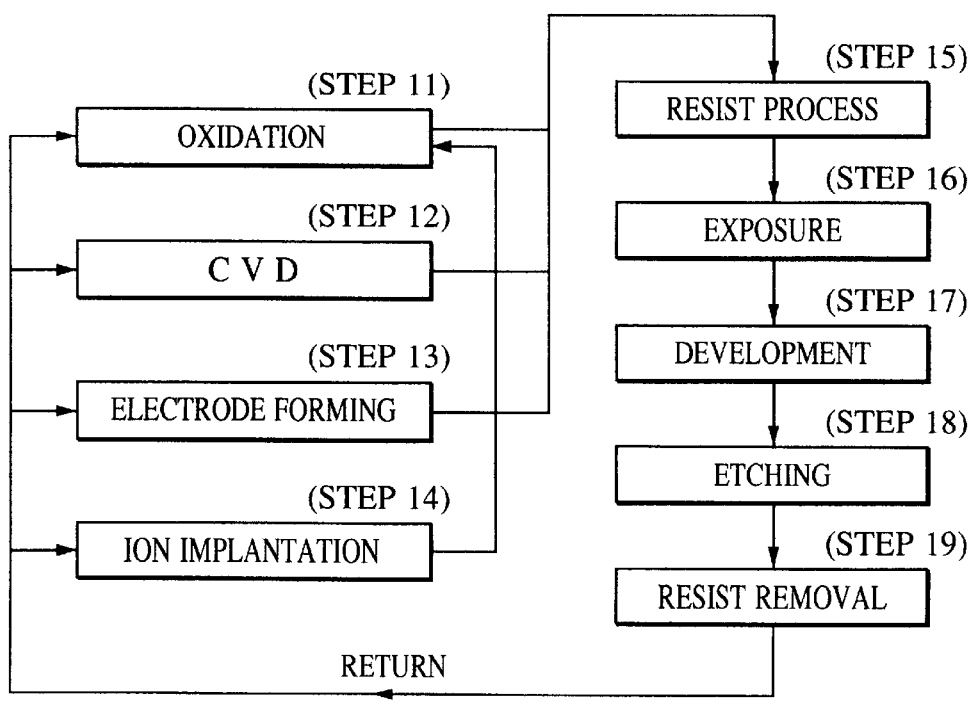
FIG. 13 is a flow diagram showing the wafer process in the method for manufacturing the device.

FIG. 13 is a detailed flow diagram of the wafer process. In step 11 (oxidation), the surface of the wafer is oxidized. In step 12 (chemical vapor deposition—CVD), an insulating film is formed on the wafer surface.

In step 13 (electrode forming), an electrode is deposited on the wafer. In step 14 (ion implantation), ions are implanted to the wafer. In step 15 (resist process), a photosensitive agent is applied on the wafer. In step 16 (exposure), the wafer is exposed to the circuit pattern of a mask through the already-described projection aligner.

In step 17 (development), the exposed wafer is subjected to a development process. In step 18 (resist removal), a resist, no longer required after etching, is removed. The circuit pattern is formed in a multi-layer fashion on the wafer after undergoing a repetition of these steps.

The manufacturing method of the second embodiment permits, to be easily manufactured, a semiconductor device having a high degree of integration, which was conventionally difficult to manufacture.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus comprising:
an illumination optical system for illuminating a reticle having a pattern;
a projection optical system for projecting the pattern onto a substrate;
a first illuminance distribution changing means for changing an illuminance distribution on a surface to be illuminated, symmetrically with respect to an optical axis;
and a second illuminance distribution changing means for changing the illuminance distribution on the surface to be illuminated, asymmetrically with respect to the optical axis,
wherein said exposure apparatus separates the illuminance distribution on the surface to be illuminated into a component symmetrical with respect to the optical axis and a component asymmetrical with respect to the optical axis, and said first and second illuminance distribution changing means independently change the respective components.

2. An exposure apparatus according to claim 1, further comprising illuminance distribution measurement means for measuring the illuminance distribution on the surface to be illuminated, wherein said first and second illuminance distribution changing means change the illuminance distribution on the surface to be illuminated, based on information from said illuminance distribution measurement means.

3. An exposure apparatus according to claim 1, further comprising:
illumination conditions changing means for changing illumination conditions on the surface to be illuminated; and
control means for controlling said first and second illuminance distribution changing means to change the illuminance distribution on the surface to be illuminated in accordance with the illumination conditions changed by said illumination conditions changing means.

4. An exposure apparatus according to claim 3, further comprising memory means for storing control information, for controlling said first and second illuminance distribution changing means, responsive to the illumination conditions, wherein said control means controls said first and second illuminance distribution changing means, based on the control information.

5. An exposure apparatus according to claim 3, wherein said illumination conditions changing means comprises means for switching between apertures in said illumination optical system.

6. An exposure apparatus according to claim 1, wherein said first illuminance distribution changing means comprises a lens member forming part of said optical system and drive means for moving said lens member in the direction of the optical axis.

7. An exposure apparatus according to claim 6, wherein said illumination optical system comprises an optical integrator forming a plurality of secondary light sources and a lens system for superimposing luminous fluxes from the plurality of secondary light sources, wherein said lens member is part of said lens system.

8. An exposure apparatus according to claim 1, wherein said second illuminance distribution changing means comprises an optical filter and drive means for moving said optical filter in a plane perpendicular to the optical axis.

9. An exposure apparatus according to claim 8, wherein said illumination optical system comprises an optical integrator forming a plurality of secondary light sources, wherein said optical filter is spaced apart a predetermined distance from an entrance surface of said optical integrator.

10. An exposure apparatus according to claim 9, wherein said optical integrator comprises a plurality of micro-lenses, and said optical filter comprises a light quantity adjuster for adjusting a light quantity transmitted through an area corresponding to a micro-lens.

11. An illumination apparatus comprising:
   an illumination optical system for illuminating a surface;
   a first illuminance distribution changing means for changing an illuminance distribution on the surface to be illuminated, symmetrically with respect to an optical axis; and
   a second illuminance distribution changing means for changing the illuminance distribution on the surface to be illuminated, asymmetrically with respect to the optical axis,
   wherein said illumination apparatus separates the illuminance distribution on the surface to be illuminated into a component symmetrical with respect to the optical axis and a component asymmetrical with respect to the optical axis, and said first and second illuminance distribution changing means independently change the respective components.

12. An illumination apparatus according to claim 11, further comprising illuminance distribution measurement means for measuring the illuminance distribution on the surface to be illuminated, wherein said first and second illuminance distribution changing means change the illuminance distribution on the surface to be illuminated, based on information from said illuminance distribution measurement means.

13. An illumination apparatus according to claim 11, further comprising:
   illumination conditions changing means for changing illumination conditions on the surface to be illuminated; and
   control means for controlling said first and second illuminance distribution changing means to change the illuminance distribution on the surface to be illuminated in accordance with the illumination conditions changed by said illumination conditions changing means.

14. An illumination apparatus according to claim 13, further comprising memory means for storing control information, for controlling said first and second illuminance distribution changing means, responsive to the illumination conditions, wherein said control means controls said first and second illuminance distribution changing means, based on the control information.

15. An illumination apparatus according to claim 13, wherein said illumination conditions changing means comprises means for switching between apertures in said illumination optical system.

16. An illumination apparatus according to claim 11, wherein said first illuminance distribution changing means comprises a lens member forming part of said optical system and drive means for moving said lens member in the direction of the optical axis.

17. An illumination apparatus according to claim 16, wherein said illumination optical system comprises an optical integrator forming a plurality of secondary light sources and a lens system for superimposing luminous fluxes from the plurality of secondary light sources, wherein said lens member is part of said lens system.

18. An illumination apparatus according to claim 11, wherein said second illuminance distribution changing means comprises an optical filter and drive means for moving said optical filter in a plane perpendicular to the optical axis.

19. An illumination apparatus according to claim 18, wherein said illumination optical system comprises an optical integrator forming a plurality of secondary light sources, wherein said optical filter is spaced apart a predetermined distance from an entrance surface of said optical integrator.

20. An illumination apparatus according to claim 19, wherein said optical integrator comprises a plurality of micro-lenses, and said optical filter comprises a light quantity adjuster for adjusting a light quantity transmitted through an area corresponding to a micro-lens.

21. A device manufacturing method comprising the steps of:
   illuminating a reticle having a pattern with an illumination optical system;
   projecting the pattern onto a substrate using a projection optical system;
   changing, with a first illuminance distribution changing means, an illuminance distribution on a surface to be illuminated, symmetrically with respect to an optical axis;
   changing, with a second illuminance distribution changing means, the illuminance distribution on the surface to be illuminated, asymmetrically with respect to the optical axis;
   separating the illuminance distribution on the surface to be illuminated into a component symmetrical with respect to the optical axis and a component asymmetrical with respect to the optical axis;
   independently changing, with the first and second illuminance distribution changing means, the respective components;
   exposing the substrate to the pattern formed on the reticle; and
   developing the pattern on the exposed substrate.

22. A device manufacturing method according to claim 21, further comprising measuring, with illuminance distribution measurement means, the illuminance distribution on the surface to be illuminated, and changing, with the first and second illuminance distribution changing means, the illuminance distribution on the surface to be illuminated, based on information from the illuminance distribution measurement means.

23. A device manufacturing method according to claim 21, further comprising:
   changing, with illumination condition changing means, illumination conditions on the surface to be illuminated; and
   controlling, with control means, the first and second illuminance distribution changing means to change the illuminance distribution on the surface to be illuminated in accordance with the illumination conditions changed by the illumination conditions changing means.

24. A device manufacturing method according to claim 23, further comprising storing, in memory means, control information, for controlling the first and second illuminance distribution changing means, responsive to the illumination conditions, and controlling, with the control means, the first and second illuminance distribution changing means, based on the control information.

25. A device manufacturing method according to claim 23, further comprising switching, using the illumination conditions changing means, between apertures in the illumination optical system.

26. A device manufacturing method according to claim 21, wherein the first illuminance distribution changing means comprises a lens member forming part of the optical system and drive means for moving the lens member in the direction of the optical axis.

27. A device manufacturing method according to claim 26, wherein the illumination optical system comprises an optical integrator forming a plurality of secondary light sources and a lens system for superimposing luminous fluxes from the plurality of secondary light sources, wherein the lens member is part of the lens system.

28. A device manufacturing method according to claim 21, wherein the second illuminance distribution changing means comprises an optical filter and drive means for moving the optical filter in a plane perpendicular to the optical axis.

29. A device manufacturing method according to claim 28, wherein the illumination optical system comprises an optical integrator forming a plurality of secondary light sources, wherein the optical filter is spaced apart a predetermined distance from an entrance surface of the optical integrator.

30. A device manufacturing method according to claim 29, wherein the optical integrator comprises a plurality of micro-lenses, and the optical filter comprises a light quantity adjuster for adjusting a light quantity transmitted through an area corresponding to a micro-lens.

* * * * *

UNITED STATES PATENT AND TRADEMARK OFFICE
CERTIFICATE OF CORRECTION

PATENT NO.     : 6,285,442 B1
DATED          : September 4, 2001
INVENTOR(S)    : Hiroshi Sato It is certified that error appears in the above-identified patent and that said Letters Patent is hereby corrected as shown below:

<u>Title page,</u>
FOREIGN PATENT DOCUMENTS, "45-47640    2/1993 (JP)" should read
-- 5-47640    2/1993 (JP) --.

<u>Column 2,</u>
Line 3, "small a" should read -- small σ --.

<u>Column 6,</u>
Line 18, "mechanism.20," should read -- mechanism 20, --.

<u>Column 12,</u>
Line 9, "axis;" should read -- axis; and --.
Line 10, "and" should be deleted.

Signed and Sealed this

Twenty-sixth Day of March, 2002

Attest:

JAMES E. ROGAN
*Attesting Officer*    *Director of the United States Patent and Trademark Office*